United States Patent
Adivarahan et al.

(10) Patent No.: US 8,354,663 B2
(45) Date of Patent: Jan. 15, 2013

(54) MICRO-PIXEL ULTRAVIOLET LIGHT EMITTING DIODE

(75) Inventors: Vinod Adivarahan, Columbia, SC (US); Asif Khan, Irmo, SC (US); Rubina Khan, Irmo, SC (US)

(73) Assignee: Nitek, Inc., Irmo, SC (US)

( * ) Notice: Subject to any disclaimer, the term of this patent is extended or adjusted under 35 U.S.C. 154(b) by 407 days.

(21) Appl. No.: 12/673,476

(22) PCT Filed: Aug. 13, 2008

(86) PCT No.: PCT/US2008/073030
§ 371 (c)(1),
(2), (4) Date: Jun. 18, 2010

(87) PCT Pub. No.: WO2009/023722
PCT Pub. Date: Feb. 19, 2009

(65) Prior Publication Data
US 2010/0264401 A1     Oct. 21, 2010

Related U.S. Application Data

(60) Provisional application No. 60/935,491, filed on Aug. 14, 2007.

(30) Foreign Application Priority Data

Oct. 17, 2007  (WO) .................. PCT/US2007/08162

(51) Int. Cl.
*H01L 29/06* (2006.01)

(52) U.S. Cl. .................... 257/13; 257/E33.005; 438/47; 977/755

(58) Field of Classification Search .................... 257/13, 257/E33.005; 438/47; 977/755
See application file for complete search history.

(56) References Cited

U.S. PATENT DOCUMENTS

| | | | | |
|---|---|---|---|---|
| 6,410,940 | B1 | 6/2002 | Jiang et al. | 257/82 |
| 6,885,036 | B2 | 4/2005 | Tarsa et al. | 257/99 |
| 7,635,875 | B2* | 12/2009 | Niki et al. | 257/98 |
| 2006/0091786 | A1 | 5/2006 | Chakraborty et al. | 313/500 |
| 2010/0187550 | A1* | 7/2010 | Reed et al. | 257/98 |

OTHER PUBLICATIONS

Patent Cooperation Treaty, International Search Report, PCT/uw2008/073030, Jan. 29, 2009, Joon Sung Lee.

(Continued)

*Primary Examiner* — Jami M Valentine
(74) *Attorney, Agent, or Firm* — Joseph T. Guy; Nexsen Pruet, LLC

(57) ABSTRACT

An ultra-violet light-emitting diode (LED) array, 12, and method for fabricating same with an AlInGaN multiple-quantum-well active region, 500, exhibiting stable cw-powers. The LED includes a template, 10, with an ultraviolet light-emitting array structure on it. The template includes a first buffer layer, 321, then a second buffer layer, 421, on the first preferably with a strain-relieving layer in both buffer layers. Next there is a semiconductor layer having a first type of conductivity, 500, followed by a layer providing a quantum-well region, 600, with an emission spectrum ranging from 190 nm to 369 nm. Another semiconductor layer having a second type of conductivity is applied next, 800. A first metal contact, 980, is a charge spreading layer in electrical contact with the first layer and between the array of LED's. A second contact, 990, is applied to the semiconductor layer having the second type of conductivity, to complete the LED.

48 Claims, 5 Drawing Sheets

OTHER PUBLICATIONS

High-Power Deep Ultraviolet Light-Emitting Diodes Based on a Micro-Pixel Design, Applied Physics Letters, vol. 85, No. 10, Sep. 6, 2004, Adivarahan et al.

Efficiency of GaN/InGaN Light-Emitting Diodes With Interdigitated Mesa Geometry, Applied Physics Letters, vol. 79, No. 13, Sep. 24, 2001, Guo et al.

Matrix Addressable Micro-Pixel 280 nm Deep UV Light-Emitting Diodes, Japanese Journal of Applied Physics, vol. 45, No. 12, 2006, pp. L252-L354, Wu et al.

Micro-Pixel Design Milliwatt Power 254 nm Emission Light Emitting Diode, Japanese Journal of Applied Physics, vol. 43, No. 8A, 2004, pp. L. 1035-1037, Wu et al.

* cited by examiner

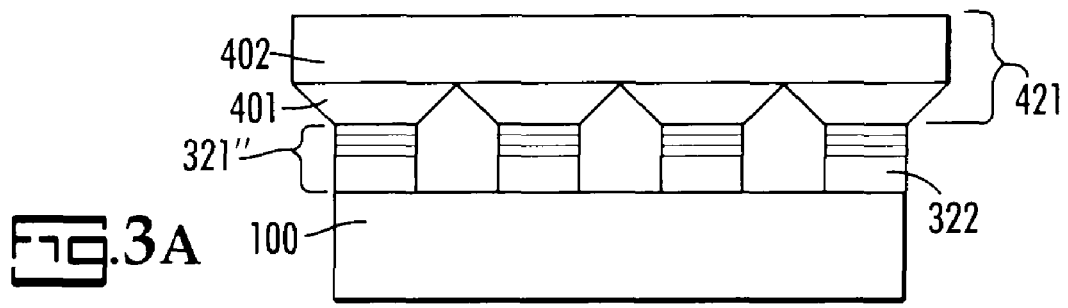
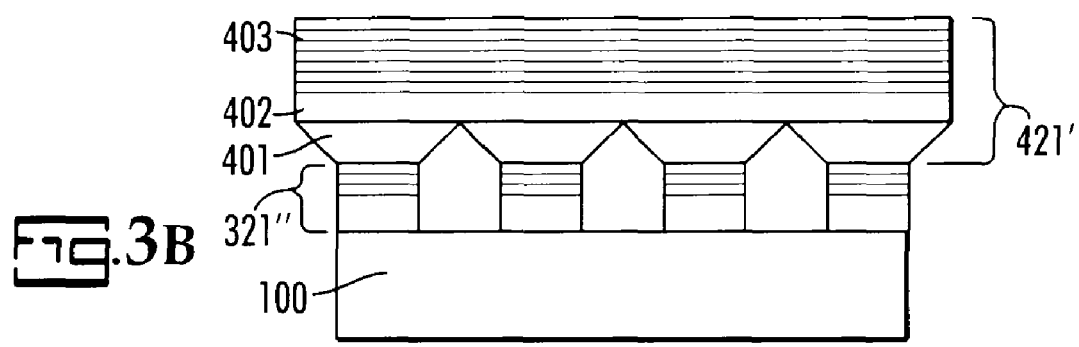
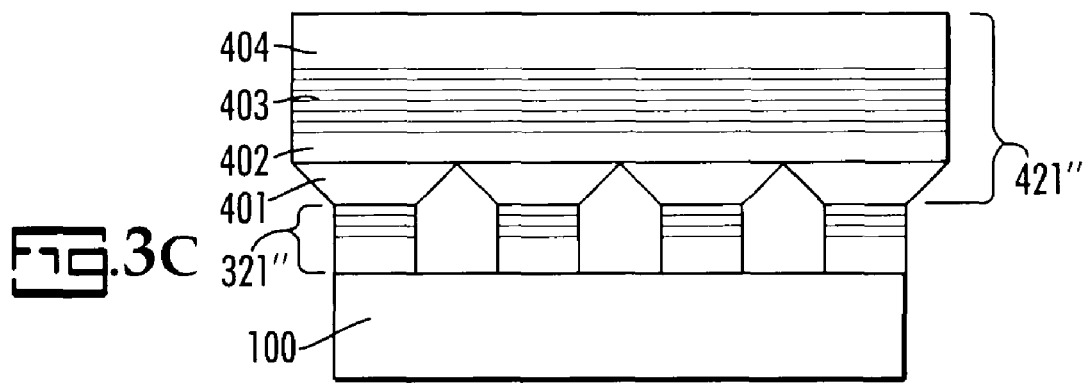

MICRO-PIXEL ULTRAVIOLET LIGHT EMITTING DIODE

CROSS-REFERENCE TO RELATED APPLICATIONS

The present application claims priority to PCT/US07/81625 filed Oct. 17, 2007 which, in turn, claims benefit to expired U.S. Provisional Appl. No. 60/852,673 filed Oct. 18, 2006 both of which are incorporated by reference. The present application also claims benefit to pending U.S. Provisional Appl. No. 60/935,491 filed Aug. 14, 2007 which is incorporated by reference.

BACKGROUND OF THE INVENTION

The present invention relates generally to a micro-pixel ultraviolet light-emitting device and method of manufacturing a light-emitting device.

Group III nitride compound semiconductors such as, for instance, gallium nitride (GaN), aluminum nitride (AlN), indium nitride (InN) (hereinafter also referred to as a "Group III-nitride semiconductor" or "III-nitrides") have been gaining attention as a material for semiconductor devices that emit green, blue or ultraviolet light. A light-emitting diode or a laser diode that emits blue light may be used for displays, for lighting and for high-density optical disk devices. A light-emitting device (which together with the acronym LED, when used herein, will for convenience also refer to both a light-emitting diode and laser diode unless otherwise specified) that emits ultraviolet radiation is expected to find applications in the field of ultraviolet curing, phototherapy, water and air purification, bio-detection, and germicidal treatment. The ultraviolet portion of the electromagnetic spectrum is often subdivided by wavelength into UVA (315-380 nm), UVB (280-315 nm) and UVC (<280 nm).

Due to the expected wide spread use of ultraviolet LED's there has been an ongoing desire to increase the light intensity and increase the available size of the LED. In many applications, such as water, air and food purification, there is an ongoing desire to provide an LED array with many high intensity LED emitters thereon. One method for achieving such an array is to combine individual distinct LED's into an array. This method is highly undesirable due to the large number of connections and the cost associated with assembly.

A preferred approach is to provide a substrate with a large number of LED's integral thereto. The present invention is directed to providing such a device, which was previously unavailable, and a method for manufacturing the device.

U.S. Pat. No. 6,410,940 to Jiang et al. describes the formation of an LED array wherein LED's are formed on a substrate. As illustrated in FIG. 1A therein an n-contact is in electrical contact with an n-type layer and a p-contact is in electrical contact with a p-type layer. As well understood in the art the n-contact and p-contact form the primary electrical contacts for electrical activation of the LED.

The configuration described in U.S. Pat. No. 6,410,940 is suitable for an LED comprising a highly conductive n-type layer. As would be readily realized from the description therein, the current must flow from the n-contact through the n-type layer and to the pillar comprising the quantum well layers and p-type layer. This application is suitable for GaN based LED's wherein the resistance of the layer is about 20Ω/□. As the aluminum content increases, such as in $Al_xGa_{1-x}N$, the resistance in the layer increases thereby rendering the structure insufficient. With low levels of Al, such as about 5-10 mole % aluminum, the resistance is about 60Ω/□. As the aluminum percentage increases, such as to about 55-60 mole fraction aluminum, the resistance increases to above about 250Ω/□. Even without aluminum the size of the array is limited since resistance in the n-type layer prohibits an extensive path length for current flow.

Group III nitride LEDs are difficult to manufacture for a number of reasons. For example, defects arise from lattice and thermal mismatch between the group III-Nitride based semiconductor layers and a substrate such as sapphire, silicon carbide, or silicon on which they are constructed. In addition, impurities and tilt boundaries result in the formation of crystalline defects. These defects have been shown to reduce the efficiency and lifetime of LEDs and LDs fabricated from these materials. These defects have been observed for III-Nitride films grown hetero-epitaxially on the above mentioned substrates with typical dislocation densities ranging from $10^8$ cm$^{-2}$ to $10^{10}$ cm$^{-2}$ for films grown via metal-organic chemical vapor deposition (MOCVD), molecular beam epitaxy (MBE), hydride vapor phase epitaxy (HVPE) and several other less common growth techniques. Reducing the dislocation density has accordingly become an important goal.

One way to reduce the dislocation density is based on the use of epitaxial lateral overgrowth (ELOG), which is a well-known technique in the prior art. With this method, the dislocation density can be reduced to $10^5$ cm$^{-2}$ to $10^6$ cm$^{-2}$. This method, however, has been shown to be ineffective for the growth of aluminum-containing III-Nitride based semiconductors because of the tendency for the aluminum to stick to the masked material and disrupt the lateral overgrowth. Several variations of this approach have also been demonstrated including PENDEO epitaxy, and FACELO growth. All of these techniques suffer from the same limitation as the ELOG approach for aluminum containing III-Nitride materials.

Additionally, a technique called cantilever epitaxy involves growth from pillars that are defined through etching as opposed to, for example, masking.

Several other approaches to dislocation reduction have been reported that do not involve selective area growth including inserting an interlayer between the substrate and the semiconductor layer to relieve strain, filtering dislocations by bending them into each other by controlling surface facet formation or by inserting a Group III-Nitride super-lattice layer as described in Applied Physics Letters, Jul. 22, 2002; Volume 81, Issue 4, pp. 604-606, between the buffer layer and the active layer.

Milli-watt power DUV LEDs on sapphire substrates with AlGaN multiple quantum well (MQW) active regions have been previously reported for the UVA, UVB and the UVC regions. The LED design used in the prior art benefited from several key innovations, namely: (1) the use of pulsed atomic layer epitaxy (PALE) to improve the quality of the buffer AlN layer; (2) the use of a PALE deposited AlN/$Al_xGa_{1-x}N$, short-period super-lattice layer insertion between the buffer AlN and the n-contact AlGaN layer for controlling the thin-film stress and mitigating epilayer cracking; and (3) a p-GaN/p-AlGaN hetero-junction contact layer for improved hole injection.

To date, under a cw-pump current of 20 mA, the average output powers for state-of-the-art UVC LEDs are about 1 mW. These LEDs typically have effective areas ranging from approximately 200 μm×200 μm to 300 μm×300 μm with various geometrical shapes demonstrated. Due to the poor thermal conductivity of the sapphire substrates, the output power quickly saturates at pump currents around 40-50 mA. At 20 mA pump current, the device lifetimes (50% power reduction) are approximately 1000 h for packaged devices that are flip-chipped to a heat sink. Without being constrained by theory, the key reasons for this power/lifetime limitation are the dislocations in the active region and the excessive heating due to the high device series and poor thermal conductivity of sapphire. Unfortunately, many commercial applications require the output powers and lifetimes to be significantly better than the best values reported to date.

Currently, several research groups are actively developing low-defect density AlN substrates to improve the power-lifetime performance of the deep UV LEDs. There are reports on a new air-bridge-assisted, high-temperature (1500° C.) lateral epitaxy approach to deposit 12-μm thick, high-quality AlN layers over SiC substrates as templates for the DUV LEDs. Pulsed lateral overgrowth (PLOG) of $Al_xGa_{1-x}N$ has previously been demonstrated as an approach for depositing 15-20 μm thick $Al_xGa_{1-x}N$ over basal plane sapphire substrates. Instead of the high temperature approach, a pulsed growth mode at 1150° C. was used to enhance Al-precursor mobilities over the growth surface. These pulsed, laterally overgrown (PLOG), $Al_xGa_{1-x}N$ layers show a significantly reduced number of threading dislocations (~$10^7$ cm$^{-2}$) in the lateral-overgrowth regions, which enabled demonstration of optically-pumped lasing at 214 nm. In previous reports, the PLOG $Al_xGa_{1-x}N$ was grown either from shallow (~0.3 μm) trenched sapphire or from thin AlN etched templates (~0.3 μm).

There are a number of reports of deep ultraviolet and visible light emitting diodes on sapphire, SiC or bulk GaN substrates using group III nitrides quantum wells in the active region. Conducting SiC and HVPE GaN substrates have the advantage of good thermal conductivity and allow for vertical conduction geometry. Unfortunately, these substrates are highly absorbing in the deep UV. Sapphire is a preferred substrate for UV LED's due to the improved light extraction efficiency yet under DC operation sapphire suffers from excessive self-heating due to the relatively high operating voltage and poor thermal conductivity of the substrate. There is a strong desire in the art to overcome the deficiencies, particularly, with regards to heat management.

However, there remains a need for a higher quality, more reliable, more robust, deep UV light-emitting diodes and laser diode arrays.

SUMMARY OF THE INVENTION

The present invention provides an ultra-violet light-emitting array and method for fabricating an ultraviolet light emitting array.

In a preferred embodiment, the present invention is a deep ultra-violet light-emitting array ($\lambda_{peak}$=200-369 nm) with an $Al_xIn_yGa_{1-x-y}N$, wherein $0<x\leq1$, $0\leq y\leq1$, and $0<x+y\leq1$, quantum-well active region on a template.

The present invention provides a reduced defect density with a group III-Nitride epitaxial layer used in conjunction with a patterned template, where the template comprises a substrate, such as sapphire, with a single or multi-layer first buffer of III-Nitride semiconductor layers that are etched into trenches. The low defect density III-Nitride second buffer layer is formed thereover by using a pulsed lateral overgrown III-Nitride layer.

The present method includes the steps of depositing a single or multiple layer buffer on the substrate, trenching the buffer layer, applying an AlInGaN second buffer layer to the trenched buffer using pulsed lateral overgrowth techniques to form the template. Next, a deep ultraviolet (DUV) light emitting structure (190 nm to 369 nm) is applied onto the template.

A feature of the present invention is that the buffer layer of the present invention can be either a single III-Nitride layer that is not thin (thickness >0.1 μm) for AlN, or comprises ternary (AlGaN, AlInN), quaternary (AlInGaN) or multiple layers of III-Nitride, preferably made of AlInGaN and containing a design optimized for both strain relief and optical transparency. In the prior art, the buffer layer comprises thin AlN in a single layer. Another feature is the use of the superlattice for both reducing defects and relieving strain. A superlattice is a series of thin layers of alternating composition that serves as a transducer from a lower layer to an upper layer, relieving stress and shifting the intralattice geometry from the first to the second layer.

Another feature of the present invention is the formation of deep trenches (depth ≧0.4 μm) before performing the PLOG growth. Etch depth was 0.1 μm in the prior art and this shallow etch depth limited the amount of lateral overgrowth that could be successfully performed because growth also takes place in the trenches. The prior art also encompassed pillars that were either AlN, or etched sapphire. In the present invention, the pillars can comprise either a single AlInGaN layer, or multiple AlInGaN layers with the etch depth greater than or equal to 0.3 μm, including any etching that occurs into the substrate.

As noted above, the prior art teaches a technique referred to as cantilevered epitaxy but this technique differs from the current invention in that it does not involve pulsing of the growth species, which provides significant benefit for enhancing lateral growth, does not involve integration of strain relief structures within the etched pillars, and does not describe the methods of formation to achieve electrically injected light emitting structures on the reduced defect material.

Yet another feature of the present invention is the growth of a thick, doped or undoped, AlInGaN layer on top of the PLOG buffer, but below the light emitting diode AlInGaN:Si n-contact layer, such that the thickness of the AlInGaN layer is greater than or equal to 1 μm.

Other features and their advantages will be apparent to those skilled in the art of semi-conductor design and light-emitting diodes in particular from a careful reading of the foregoing Detailed Description of Preferred Embodiments, accompanied by the following drawings.

BRIEF DESCRIPTION OF THE DRAWINGS

FIG. 3a is a schematic diagram of a portion of the epilayer structure of the light-emitting diode of FIG. 4, shown with a portion of the first buffer now trenched according to a preferred embodiment, and with a laterally overgrown PLOG buffer according to a preferred embodiment.

FIG. 3b is a schematic diagram of a portion of the epilayer structure of the light-emitting diode of FIG. 4, shown with a portion of the first buffer now trenched according to a preferred embodiment, and with a laterally overgrown PLOG buffer according to a preferred embodiment.

FIG. 3c is a schematic diagram of a portion of the epilayer structure of the light-emitting diode of FIG. 4, shown with a portion of the first buffer now trenched according to a preferred embodiment, and with a laterally overgrown PLOG buffer according to a preferred embodiment.

DETAILED DESCRIPTION OF PREFERRED EMBODIMENTS

Figure 4:
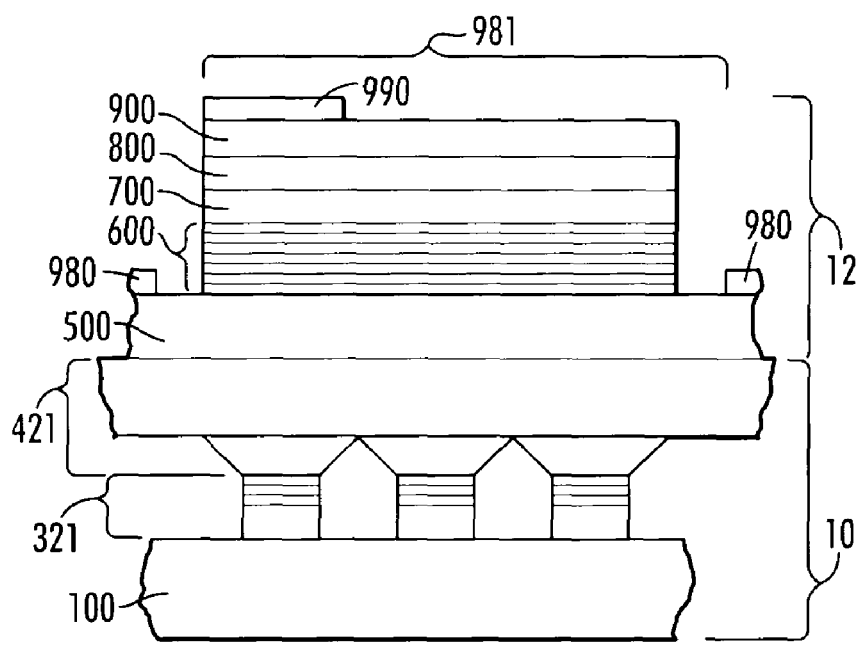
FIG. 4 is a schematic diagram of the epilayer structure of a single light-emitting diode of an array, according to a preferred embodiment of the present invention.

The present invention is an array of light-emitting devices (LED) and a method for making an array of LED's, particularly one that emits deep ultraviolet light. In particular, a template, 10, is provided that serves as a platform for an array of ultraviolet light-emitting structures, 12, as shown in FIG. 4. Briefly, template 10 includes a substrate, and a first buffer layer added onto the substrate as the first step in forming the LED wafer.

The template may include a substrate but has two buffer layers, one of which is trenched and the second of which preferably forms a coalesced planar layer over the first. The coalescing involves performing PLOG over deep trenches (height 0.4 μm in case of AlN), or over shallow or deep trenches if the pillars encompass more than one group III species or a combination of multiple layers. The pillars may comprise a multi-layer stack of III-Nitride based semiconductors including AlN, and a strain-relieving superlattice in an array. In some embodiments additional layers are included in the pillars on top of the superlattice including $Al_xIn_yGa_{1-x-y}N$ (wherein $0<x\leq1$, $0\leq y\leq1$, and $0<x+y\leq1$), and additional superlattices with different average composition than the first superlattice. The second buffer layer, of AlN or $Al_xIn_yGa_{1-x-y}N$ (wherein $0<x\leq1$, $0\leq y\leq1$ and $0<x+y\leq1$), is grown by PLOG techniques over the etched pillars preferably until it coalesces to form a planar surface. The ultraviolet light-emitting structure deposited on top of the planar surface on the template consists of PALE or conventional MOCVD deposited AlN, and in some embodiments an additional strain relief superlattice is deposited on the AlN. A thick (thickness $\geq1.5$ μm) undoped or n-type $Al_xIn_yGa_{1-x-y}N$ (wherein $0<x\leq1$ and $0\leq y\leq1$, and $0<x+y\leq1$) layer is deposited next. If the $Al_xIn_yGa_{1-x-y}N$ (wherein $0<x\leq1$, $0\leq y\leq1$ and $0<x+y\leq1$) is undoped, an additional n-type $Al_xIn_yGa_{1-x-y}N$ (wherein $0<x\leq1$ and $0\leq y\leq1$) layer is deposited. This is followed by the quantum well active region and p-type $Al_xIn_yGa_{1-x-y}N$ (wherein $0\leq x\leq1$, $0\leq y\leq1$ and $0\leq x+y\leq1$) materials that form the top electrode for the light emitting device. Without wishing to be bound by theory, the superior performance of the present light-emitting diodes is attributed to the combination of reduced thermal impedance from the thick PLOG growth AlN or $Al_xIn_yGa_{1-x-y}N$ (wherein $0<x\leq1$, $0\leq y\leq1$ and $0<x+y\leq1$) material, and a lower overall defect density in the laterally overgrown AlN or $Al_xIn_yGa_{1-x-y}N$ (wherein $0<x\leq1$, $0\leq y\leq1$ and $0<x+y\leq1$) buffer. A current spreading layer is applied to the n-type layer wherein the current spreading layer is separated from the furthest inward extent of the n-type layer by no more than the current spreading length.

The first buffer layer is then etched to form a pattern of trenches with etch depth greater than or equal to 0.4 μm if the buffer is AlN and the substrate is sapphire, or greater than or equal to 0.1 μm if the first buffer layer consists of one or more AlInGaN layers. After patterning the wafer, a second buffer is applied to the first buffer. In one embodiment the second buffer layer coalesces over the etched portion. Next, the ultraviolet light-emitting structure, 12, is applied to template, 10. First, a semiconductor layer having a first type of conductivity is applied, followed by several layers forming a quantum-well region with an emission spectrum ranging from 190 nm to 369 nm. Another semiconductor layer, or possibly more than one, having a second type of conductivity is applied next. Two metal contacts are applied to this construction. A leakage suppression layer, 980, is applied to the semiconductor layer having the first type of conductivity and a metal contact, 990, is applied to the other semiconductor layer having the second type of conductivity, to complete the LED. Each of these layers will be described in detail below. The charge spreading layer is separated from the furthest inward extent of the LED by a distance, 981, which is no larger than the current spreading length.

Several of the layers and buffer layers are applied using a pulsed atomic layer epitaxy (PALE) growth technique, and the layer grown on the patterned wafer is grown using pulsed lateral overgrowth techniques. Each layer other than the substrate, which is preferably sapphire, is made of a Group III-nitride, preferably $Al_xIn_yGa_{1-x-y}N$ (wherein $0<x\leq1$, $0\leq y\leq1$ and $0<x+y\leq1$). In employing pulsed lateral overgrowth techniques, the precursor sources include a metal-organic source (preferably trimethyl aluminum, trimethyl gallium, triethyl gallium, trimethyl indium, ammonia, a carrier gas (such as hydrogen and/or nitrogen) and, optionally, doping sources such as silane, and/or biscyclopentadienyl magnesium.

Figure 1:
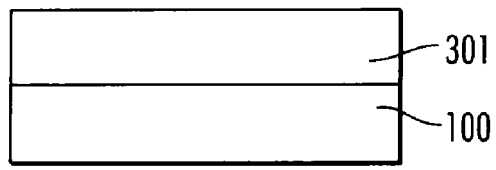
FIG. 1 is a schematic diagram of the epilayer structure of a portion of a light-emitting diode having a single III-Nitride buffer layer, according to a preferred embodiment of the present invention.
Figure 2A:
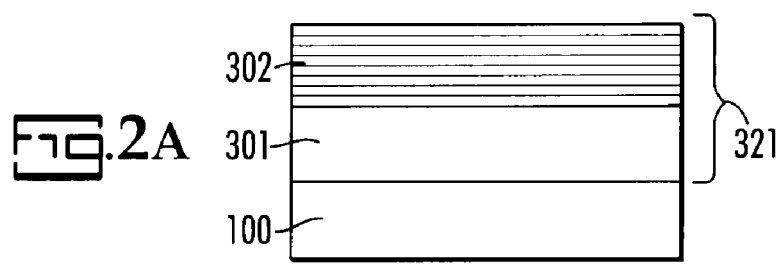
FIG. 2a is a schematic diagram of the epilayer structure of a portion of a light-emitting diode having multiple III-Nitride buffer layers, according to a preferred embodiment of the present invention.
Figure 2B:
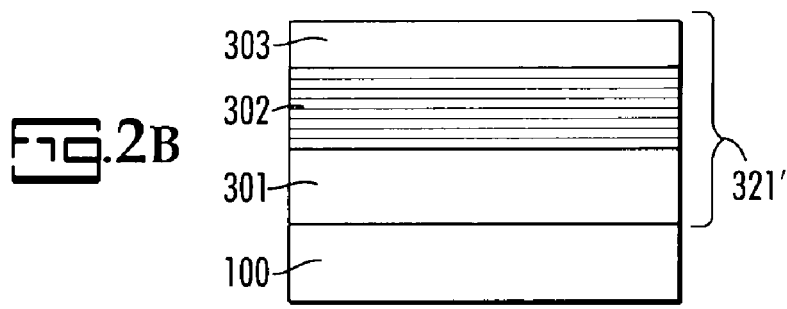
FIG. 2b is a schematic diagram of the epilayer structure of a portion of a light-emitting diode having multiple III-Nitride buffer layers, according to another preferred embodiment of the present invention.
Figure 2C:
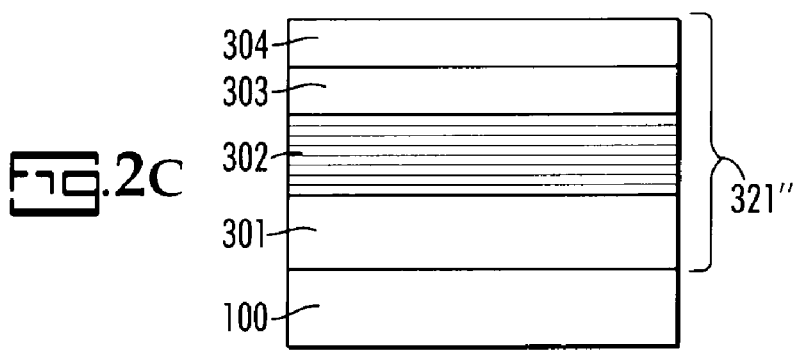
FIG. 2c is a schematic diagram of the epilayer structure of a portion of a light-emitting diode having multiple III-Nitride buffer layers, according to another preferred embodiment of the present invention.

FIGS. 1-3 show various embodiments of template, 10, of the present LED as it is constructed. As shown in FIG. 1, a first buffer layer, 301, is grown on a substrate, 100. Sapphire is a preferred substrate. First buffer layer, 301, is made of a Group III-Nitride material, preferably $Al_xIn_yGa_{1-x-y}N$ (wherein $0<x\leq1$, $0\leq y\leq1$ and $0<x+y\leq1$). Alternatively, as shown in FIG. 2A-2C, a first buffer layer, 321, may actually be made of multiple sub-layers. FIGS. 2A, 2B, and 2C show three different implementations of first buffer layer 321, 321' and 321", respectively, using sub-layers 301, 302, 303, 304 of a Group III-Nitride material, preferably $Al_xIn_yGa_{1-x-y}N$ (wherein $0<x\leq1$, $0\leq y\leq1$ and $0<x+y\leq1$). Sub-layer, 301, is preferably made of $Al_xIn_yGa_{1-x-y}N$ (wherein $0<x\leq1$, $0\leq y\leq1$ and $0<x+y\leq1$). Sub-layer, 302, is preferably an AlInGaN/AlInGaN super-lattice. Sub-layer 303 is preferably undoped AlInGaN while sub-layer 304 is AlInGaN doped with silicon. Buffer layer 321 in FIG. 2A includes sub-layers 301 and 302. Buffer layer 321' in FIG. 2B includes sub-layers 301, 302, and 303. Buffer layer 321" in FIG. 2C includes sub-layers 301, 302, 303, and 304.

The first III-Nitride buffer layer 321 is grown to approximately 0.1-5 μm thick, depending on the composition and sequence of layers used, over a substrate 100 using a combination of the pulsed atomic layer epitaxy (PALE) technique and conventional metal-organic chemical vapor deposition (MOCVD). First buffer layer 321 is preferably formed of at least one sub-layer of $Al_xIn_yGa_{1-x-y}N$, wherein (wherein $0<x\leq1$, $0\leq y\leq1$ and $0<x+y\leq1$)

Next, a portion of the final LED epilayer is trenched. The trenching is done in first buffer layer 321, and may also extend into substrate 100. The trenching process is performed using standard photolithographic techniques in combination with either wet or dry etching processes that are well established in the prior art. However, the trenches can be much deeper than in the prior art. In particular, the trenches are at least 0.4 μm deep if the first buffer layer is made of AlN and at least 0.1 μm deep if the first buffer layer 321, 321' or 321" are used.

Trenching is the selective removal of material leaving narrow strips of material or pillars remaining as seen in FIGS. 3A-3C. These narrow strips may be straight or curved but are preferably parallel and most preferably patterned, such as for example in stripes, circles, hexagons, squares or rectangles.

After patterning a layer 401 is applied to the first buffer by pulsed lateral overgrowth techniques so that it will grow laterally. It is preferable that the lateral growth continue until coalescence thereby bridging the gaps between the stripes as illustrated in FIG. 3A-3C. Layer 401 is preferably made of $Al_xIn_yGa_{1-x-y}N$ (wherein $0<x\leq1$, $0\leq y\leq1$ and $0<x+y\leq1$). After the layer 401 is completed, as shown for each of the three embodiments illustrated in FIG. 3A-3C, additional layers may be deposited to complete alternate preferred embodiments of second buffer layers 421, 421' and 421".

FIG. 3A shows one implementation of a second buffer, 421, on top of the epilayer construction shown in FIG. 2C, after trenching first buffer layer 321" to form pillars 322. Note that any first buffer layer: 321, 321' or 321", could be used, but only the epilayer of FIG. 2C, namely with first buffer layer 321", is shown in FIGS. 3A-3C in order to simplify the drawings. FIGS. 3B and 3C show additional implementations of the second buffer, 421, namely, 421' and 421", in FIGS. 3B and 3C, respectively, with sub-layers 401, 402, 403, and 404 shown in particular combinations in each of FIGS. 3A-3C. FIG. 3A shows second buffer layer, 421, which includes sub-layers, 401 and sub-layer 402. FIG. 3B shows second buffer layer, 421', which includes sub-layers 401, 402, and 403. FIG. 3C shows second buffer layer, 421", which includes sub-layers 401, 402, 403, and 404.

FIG. 4 illustrates template 10 of FIG. 3C, now with a layered, UV-emitting structure, 12, thereon (which UV-emitting structure including layers 500, 600, 700, 800 and 900), as will be described below, plus metal contacts 980 and 990. Except for metal contacts, 990 and 980, and the substrate 100, all layers are made of III-Nitride material.

Buffer layer 321, and in some cases substrate 100, is then trenched. After trenching, the PLOG layer 401 is grown on the buffer layer to cause the wafer surface preferably to coalesce over the formed trenches (see FIGS. 3A, 3B, 3C and 4). The Group III-Nitride PLOG layer 401 is grown by pulsing at least one precursor source to enhance the lateral growth rate over vertical growth rate until PLOG layer 401 is of sufficient thickness and more preferably completely coalesced and has regions with dislocation densities less than that of buffer layer 321.

In one embodiment the buffer layers are grown over each pillar without coalescence thereby forming discrete LED's on a common substrate. In this embodiment each subsequent layer referred to herein is a distinct layer which is physically distinct from an identical layer on an adjacent pillar.

Subsequently, additional AlInGaN layers are deposited that together with 401, form a second buffer 421. These layers are shown as 402, 403, and 404 in FIGS. 3A, 3B, and 3C. These layers help to minimize overall strain of the epitaxial layer and also assist with epitaxial planarization that has beneficial effects for the light emitting device active region.

Then, as illustrated in FIG. 4, the LED structure is added to the epilayer beginning with another III-Nitride layer 500 but with a first type of conductivity, applied directly on second buffer 421, preferably an n+ layer made of $Al_xIn_{1-x}Ga_{1-x-y}N$ (wherein $0<x\leq1$, $0\leq y\leq1$ and $0<x+y\leq1$) is formed such that the layer is transparent to light to be emitted from the quantum well active region. Another III-Nitride superlattice layer 600 is then formed which includes one or more barrier and one or more well sub-layers, each having different compositions such that the band-gap of the barrier layer is larger than that of the well layer. The thickness of the barrier and well layers should be between 1-200 Å. This well sub-layer has a specific band-gap and is designed to provide a region with good quantum confinement, wherein electrons and holes readily combine, preferably with radiative and non-radiative recombination but with radiative recombination dominating the non-radiative recombination. The quantum well sub-layer emits light in the range of 190 nm to 369 nm. Both layers 500 and 600 are given their first type of conductivity using silicon, or are co-doped using a combination of silicon, oxygen, and/or indium. Layer 500 has a band gap lower than the PLOG layer 401 but higher than the quantum well and barrier sub-layers of 600. In some implementations, the well sublayers are undoped.

A p-type AlInGaN electron blocking layer 700 is incorporated directly above the active region layer, 600, such that the band-gap of 700 is larger than the bandgap of the barrier sublayer in 600. Magnesium is used as the p-type dopant. Two additional p-type AlInGaN layers, 800 and 900, are formed on top of 700 such that the band-gap of the layers decreases for each subsequent layer. Layer 800 may be one single AlInGaN layer, or may consist of a compositionally graded layer, a series of decreasing composition superlattices, or several distinct layers with decreasing bandgap.

A mesa-type LED may then be fabricated, the type shown in FIG. 4, using reactive ion etching (RIE) to access the bottom n+ layer. Note that this type device's geometry results in only a portion of the active area containing low-defect density laterally grown "wing" regions. Finally, probe metal conducting pads 980, 990 are deposited on both the n+ and p+ layers, respectively. Ti/Al/Ti/Au and Ni/Au are used as metal contacts for the n- and p-contacts, respectively, however, the n-metal contacts can be made of Ti, Al, Ni, Au, Mo, Ta or any combination of these metals. The second contact, the p+ layer contact, can be made of Pd, Ni, Ag, Au, ITO, NiO, PdO or any combination of the above-mentioned metals. These contacts could be annealed in air, a forming gas, nitrogen or any combination of such. In one embodiment, the anneal temperature cycle is a single step with a temperature range of 650° C.-950° C. In another embodiment, the annealing cycle may comprise multiple step annealing. The second metal electrode on top of individual pillars are thickened by depositing additional titanium and gold layers. Annealing of said second electrode is done in nitrogen ambient. In another embodiment, the annealing can be done in air, oxygen ambient also.

Mesa etching preferable employs a mask comprising titanium, nickel and platinum which can be deposited by e-beam evaporation, sputtering or the like. Boron trichloride, chlorine and argon gas represent preferred materials in the etching chamber. The reactive ion etching, or dry etching, preferably comprises either inductively coupled plasma or reactive ion plasma. This dry etching comprises a multistep RF power modulation with chlorine, boron chloride, carbon tetrachloride, methane, fluorine, argon gas or a combination of such gases.

In an alternative embodiment, the etching may be done by dry etching followed by wet chemical etching. For wet chemical etching the device may be dipped and the semiconductor layers boiled in organic solution such as acetone, toluene or iso-propanol. The layers may also be dipped in acidic solutions such as aqua-regia, buffered HF, HF, HCl and the like.

In an alternative configuration, after construction the substrate may be removed by polishing, etching or lifting-off using a laser and then a metallic contact layer can be applied to the backside the n-layer 500. In this configuration, contact 980 is located on the backside of 500 instead of the topside and can be located vertically below the p-contact 990.

Figure 5:
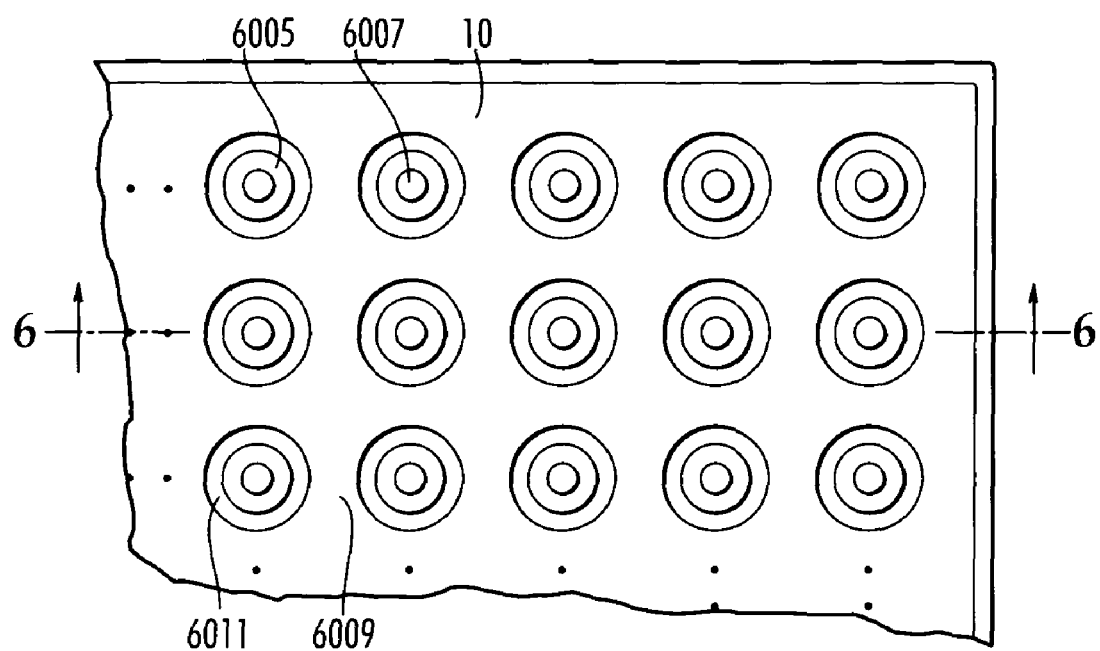
FIG. 5 is a top perspective view of a partial schematic representation of an embodiment of the invention.
Figure 6:
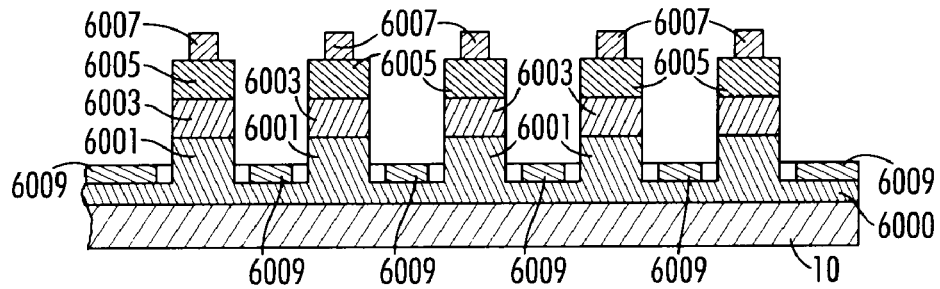
FIG. 6 is a side view of a schematic representation of an embodiment of the invention.

An embodiment of the invention prior to formation of a second electrical contact is illustrated schematically in top view in FIG. 5 and in cross-sectional view in FIG. 6. A substrate, 10, as described previously comprises the layer of first conductivity, 6000, applied thereto. It is preferred that the layer of first conductivity is an n-type layer. The layer of first conductivity has mesas, 6001, of common composition. The mesas may be formed during layer formation or the area there between may be etched. On the surface of each mesa is a quantum well, 6003. On the surface of the quantum well is a layer of second conductivity, 6005. The layer of second conductivity has a conductivity which is different than the conductivity of the layer of first conductivity as would be realized. The layer of first conductivity, quantum well and layer of second conductivity, taken together, form an LED and each layer may include multiple sublayers as further described herein. A second conductor, 6007, is in electrical contact with the layer of second conductivity. A charge spreading layer, 6009, is applied to the layer of first conductivity. It is preferred that the charge spreading layer be separated from the mesa by a gap, 6011, which may have non-conductive material therein. The separation between the mesa and charge spreading layer insures that electrical contact between the charge spreading layer and quantum well and/or second conductivity layer does not occur during manufacturing. It would be apparent that a current between the charge spreading layer and second conductive layer of a given LED would cause the LED to emit light.

The equivalent diameter of the mesas, also referred to as micropillars, is preferably about 500 μm or less. The equivalent diameter is the diameter of a circle with a surface area equivalent to the surface area of the shape being measured.

Figure 7:
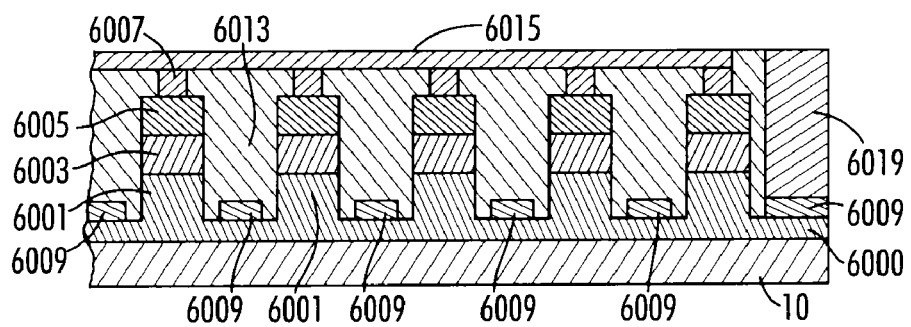
FIG. 7 is a side view of a schematic representation of an embodiment of the invention.

FIG. 7 is a cross-sectional schematic view of another embodiment of the invention. In FIG. 7, the area between the mesas comprises a passivation material, 6013, which forms a leakage current suppression layer. The device is planarized such that the leakage suppression layer and conductive layers form a single plane and a third conductive layer, 6015, is applied to be in contact with the second conductors, 6007. The third conductive layer can be a continuous layer such that when current is applied all LED's emit in unison. Alternatively, the third conductive layer may be in electrical contact with select LED's thereby allowing the LED's to illuminate individually or in select combinations. A conductive pillar, 6019, is formed such that the first and second conductors are terminated at a common face to facilitate flip-chip mounting as will be more fully described.

Figure 8:
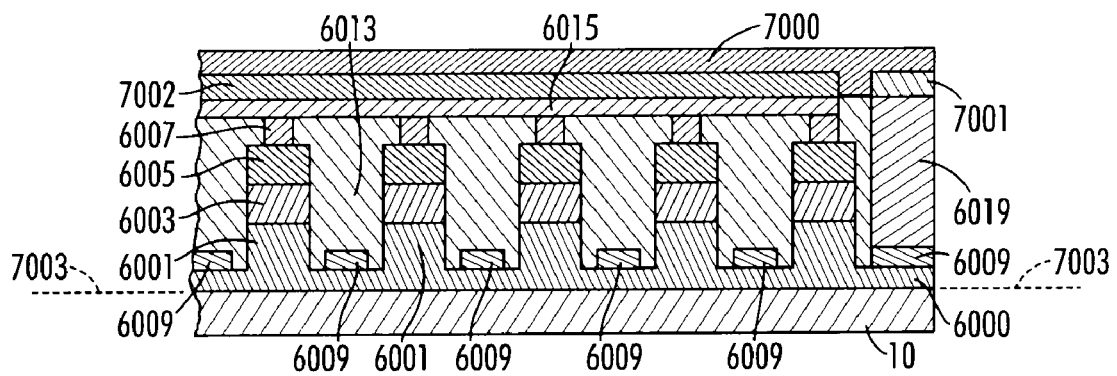
FIG. 8 illustrates a particularly preferred embodiment.
Figure 9A:
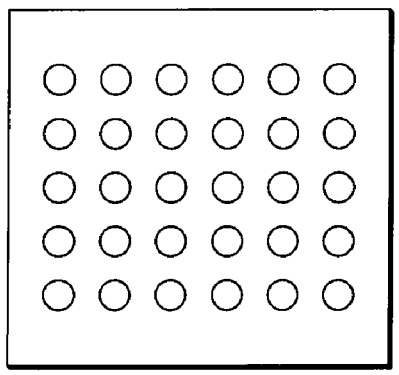
FIG. 9 illustrated various embodiments of the invention.
Figure 9B:
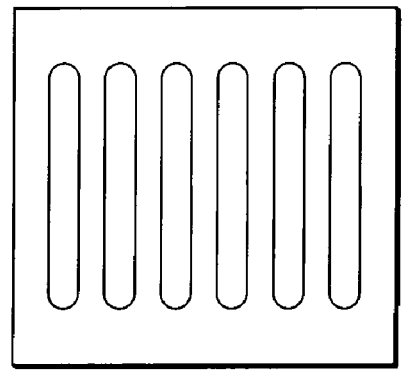
Figure 9C:
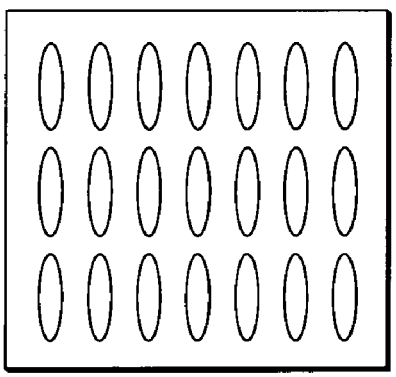
Figure 9D:
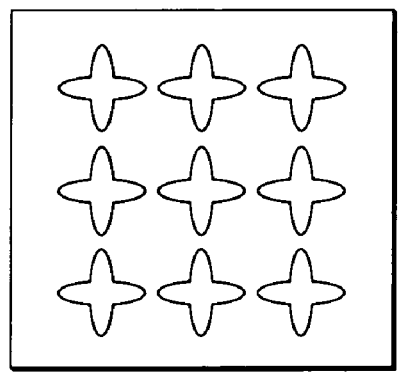
Figure 9E:
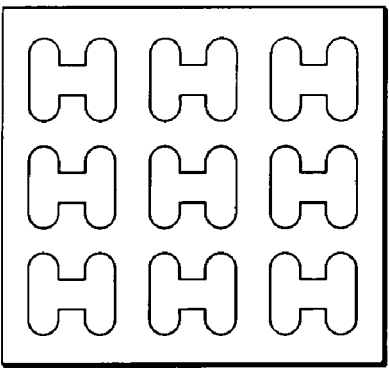
Figure 9F:
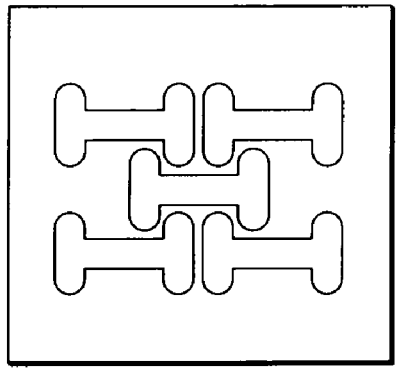

A particularly preferred embodiment is illustrated in FIG. 8. In FIG. 8, the embodiment of FIG. 7 is illustrated as mounted on a thermal carrier, also referred to as a conductive substrate, 7000. This is referred to as a flip-chip mounting. The conductive substrate, 7000, has associated therewith contacts, 7001 and 7002, for providing current to the LED. The conductive substrate provides two primary functions. The conductor functions as a heat sink thereby allowing heat to dissipate away from the LED which has many advantages as understood in the art. Once the LED is mounted on the conductive substrate the substrate, 10, used for formation of the LED can be removed along line 7003 thereby forming an LED with superior light emission properties. Particularly preferred thermal carriers include AlN, SiC, Cu, CuW or a copper alloy. In one preferred embodiment the novel metallic substrates such as Cu—W, Cu—Mo or Cu itself will be used which is a unique method of using metallic substrates for such lateral conducting LEDs. The flip-chip mounting can be done by standard techniques with gold-tin eutectic solder bonding and gold-gold thermocompression being preferred.

The passivation material provides two primary advantages. One advantage is as an insulator between the conductors. The second advantage is to fill any voids thereby allowing for a smooth surface across the face after planarization. The passivation material is preferably a material selected from a polymer, more preferably, a non-electrically conducting polymer; and a dielectric. Particularly preferred polymers include SU-8 and BCB. Particularly preferred passivating dielectric materials include silicon-dioxide, silicon nitride and silicon oxynitride. The passivation material may be suitably deposited by plasma-enhanced chemical vapor deposition (PECVD) or chemical vapor deposition (CVD). The passivation and the planarization layer is also referred to herein as a leak suppression layer.

To avoid current crowding the charge spreading layer must be within the charge spreading distance of the furthest inward extent of the LED. The furthest inward extent is the furthest distance between the charge spreading layer and the LED in the plane of the charge spreading layer in any direction. In general, this will be the centermost portion of the LED. It is most preferred that the furthest inward extent be equidistance between multiple areas of the charge spreading layer. By example, a circular LED, with a charge spreading layer in a circle orientation around the LED will have a central point within the LED wherein the entire surrounding circle of the charge spreading layer will be an equal distance there from. With a square LED, there will be a central point which is an equal distance between four points of the charge spreading layer. It is most advantageous that the profile of the void in the charge spreading layer be the same shape as the LED.

Various configurations of the LED are illustrated in FIGS. 9a-f. The LED shape may be round, oval, obround, rectangular, trigonal, polygonal or combinations thereof. The LED may also comprise a central structure with lobes extending therefrom. For example, the LED may have a central portion with circular, or arcuate extensions. The shapes are chosen to minimize the occurrence of any portion of the LED being further than the charge spreading length as more specifically set forth herein. Furthermore, the LED shapes are chosen such that the minimum distance between LED's can be achieved, or maximum number of LED's can be contained in a given area. The LED's are preferably separated by a distance sufficient to avoid ohmic resistance.

Current spreading length $L_S$ is defined as $L_S=(R_c/R_{sh})^{1/2}$, where $R_c$ is the total "vertical" resistance including contact and top p-layer spreading components per unit area, and $R_{sh}$ is the sheet resistance of the bottom n-layer. For a typical 280 nm LED, $R_c \approx 1.35 \times 10^{-3}$ $\Omega cm^2$ and $R_{sh}=105$ $\Omega/cm^2$, and hence $L_S$ is only 30-40 μm at high operating currents.

The bottom $n^+$-AlGaN is preferably accessed by reactive-ion-etching using chlorine plasma. The n-ohmic contact preferably comprises Ti/Al/Ti/Au patterned and deposited using a lift-off technique. The n-ohmic contact is present in the region between every pixel to avoid current crowding.

Although preferably made of sapphire, the substrate may be made of silicon carbide, GaN, AlN, AlGaN, InN, InGaN, AlInGaN, Silicon, GaAs, LiAlO3, LiGaO3, ZnO, or a metal. The substrate preferably has a crystallographic orientation along the C-plane, A-plane, M-plane or R-plane and has a mis-orientation ranging from 0.0° to 10° from its axis.

Planarization may be achieved by a standard spin-on-glass process with filled space between the pillars. This step is preferably followed by depositing ohmic contact metallization to the p-type GaN surface of each pixel using standard e-beam (electron beam) evaporation and by utilizing Ni/Au as metals. An array of interconnecting probe-bridge contacts is deposited over the surface using Ti/Au.

With the present invention all of the pixels of the large perimeter LED are illuminated uniformly indicating the absence of current crowding.

The high operating voltages, or high series resistance, of deep UV LED's stems from poor or lower doping efficiency of high aluminum content epilayers needed for such short wavelength emission. The series resistance further increases the temperature rise of the active junction by joule heating which then results in degraded device performance. The problem becomes severe with decreasing emission wavelength and with increasing device area. Increasing the device active area has adverse effects due to the severe crowding in high aluminum content layers. The present invention solves this problem.

The present invention reduces series resistance which results in a decrease in joule heating. In the micro-pillar design the diameter is within the charge spreading length. For example, for a 280 nm UV LED the mesa diameter is preferably about 25-30 µm which is less than the estimated current spreading length of 40 µm. Furthermore, the micropillar is surrounded by n-type electrode with a small distance of separation between the pillar edge and the n-type electrode edge. Since these micropillars are immersed in a pool of n-type electrode and the diameter is less than the current spreading length the current crowding problem is eliminated. Moreover, by interconnecting each pillar with the novel flat electrode over a leakage suppression layer the total device area can be increased which reduces the device resistance and operating voltages. As a consequence of this reduction, the device is much cooler than conventional UV LED's which helps in biasing these UV LEDs to much higher drive currents.

It will be apparent to those skilled in the art of ultraviolet light-emitting diodes and laser diodes that many modifications and substitutions can be made to the preferred embodiments described herein without departing from the spirit and scope of the present invention, defined by the appended claims.

What is claimed is:

1. An ultraviolet light-emitting device comprising:
a template comprising:
a first buffer layer, said buffer layer being trenched, and
a second buffer layer being coalesced over said first buffer layer, said second buffer layer comprising $Al_xIn_yGa_{1-x-y}N$, wherein $0<x\leq1$, $0\leq y\leq1$, $0<x+y\leq1$;
a first layer with a first conductivity on said template;
wherein said first layer comprises an array of mesas;
light emitting quantum well regions on each mesa of said mesas;
a second layer with a second conductivity on each quantum well region of said quantum well regions;
a first electrical contact in electrical connection with said first layer;
a current spreading layer in electrical connection with said first electrical contact wherein said current spreading layer is no further than a current spreading length of any portion of said first layer;
a second electrical contact in electrical connection with each said second layer;
a leakage suppression layer in between each mesa of said mesas;
a third electrical contact in electrical connection with said second electrical contact on each mesa of said mesas;
whereby, when an electrical potential is applied to said first and third electrical contacts, said device emits ultraviolet light.

2. The ultraviolet light-emitting device of claim 1, wherein said first buffer layer is made of $Al_xIn_yGa_{1-x-y}N$, wherein $0<x\leq1$, $0\leq y\leq1$ and $0<x+y\leq1$.

3. The ultraviolet light-emitting device of claim 1, wherein said first buffer layer is made of at least one superlattice sub-layer having plural layers of $Al_xIn_yGa_{1-x-y}N$, wherein $0<x\leq1$, $0\leq y\leq1$ and $0<x+y\leq1$.

4. The ultraviolet light-emitting device of claim 1, wherein said first buffer layer comprises a first sub-layer made of $Al_xIn_yGa_{1-x-y}N$, wherein $0<x\leq1$, $0\leq y\leq1$ and $0<x+y\leq1$, and wherein said first sub-layer is not doped.

5. The ultraviolet light-emitting device of claim 4, wherein said first buffer layer comprises a second sub-layer made of $Al_xIn_yGa_{1-x-y}N$, wherein ($0<x\leq1$, $0\leq y\leq1$ and $0<x+y\leq1$) that is doped with at least one material selected from silicon and indium.

6. The ultraviolet light-emitting device of claim 1, wherein said first buffer layer comprises:
a first sub-layer made of $Al_xIn_yGa_{1-x-y}N$, wherein $0\leq x\leq1$, $0\leq y\leq1$ and $0<x+y\leq1$, and wherein said first sub-layer is not doped;
at least one superlattice sub-layer having plural layers of $Al_xIn_yGa_{1-x-y}N$, wherein $0\leq x\leq1$, $0\leq y\leq1$ and $0<x+y\leq1$; and
a second sub-layer made of $Al_xIn_yGa_{1-x-y}N$, wherein $0<x\leq1$, $0\leq y\leq1$ and $0<x+y\leq1$, and wherein said second sub-layer is doped with at least one material selected from silicon and indium.

7. The ultraviolet light-emitting device of claim 6, wherein said first buffer layer further comprises a third sub-layer made of $Al_xIn_yGa_{1-x-y}N$, wherein $0\leq x\leq1$, $0\leq y\leq1$ and $0<x+y\leq1$, and wherein said third sub-layer is not doped.

8. The ultraviolet light emitting device of claim 1 wherein the first buffer layer comprises $Al_xIn_yGa_{1-x-y}N$ wherein $0.01<x\leq1$, $0.02\leq y\leq1$, $0.01\leq x+y\leq1$.

9. The ultraviolet light emitting device of claim 1 wherein said first buffer layer and said second buffer layer is deposited in such a way that the group III and group V materials are injected via a pulsed growth method wherein the group III and group V materials do not have continuous flow, but are pulsed either sequentially, or such that the group III source pulses are partially on with no group V source pulse or partially merged with a group V source pulse.

10. The ultraviolet light-emitting device of claim 1, wherein said second buffer layer further comprises
a first sub-layer layer coalesced over said first buffer layer to form a first planar layer; and
a second sub-layer applied to said first sub-layer.

11. The ultraviolet light-emitting device as recited in claim 10 wherein said second sub-layer is a superlattice layer.

12. The ultraviolet light-emitting device as recited in claim 11, further comprising a third sub-layer wherein said third sub-layer is a superlattice layer.

13. The ultraviolet light-emitting device as recited in claim 11, further comprising a fourth sub-layer.

14. The ultraviolet light-emitting device as recited in claim 1, wherein said first electrical contact is carried by said first buffer layer with a first conductivity.

15. The ultraviolet light-emitting device as recited in claim 1, wherein said first electrical contact is carried by said first layer with said first conductivity, and wherein said template further comprises a substrate, said first buffer layer being between said substrate and said second buffer layer.

16. The ultraviolet light-emitting device as recited in claim 15, wherein said substrate has a crystallographic orientation along a C-plane, A-plane, M-plane or R-plane.

17. The ultraviolet light-emitting device as recited in claim 1, wherein said first buffer layer is made of AlN and is selectively trenched to a depth of at least 0.1 μm.

18. The ultraviolet light emitting device as recited in claim 1, wherein said light emitting structure includes a quantum well region comprising alternating layers of:
   a quantum well comprising $Al_xIn_yGa_{1-x-y}N$ wherein $0 \leq x \leq 1$, $0 \leq y \leq 1$, and $0 \leq x+y \leq 1$, said quantum well having a surface and a band gap; and
   a barrier layer on said surface of said quantum well, said barrier layer having a band gap larger than said band gap of said quantum well, and wherein said barrier layer includes $Al_xIn_yGa_{1-x-y}N$ wherein $0 \leq x \leq 1$, $0 \leq y \leq 1$ and $0 < x+y \leq 1$, and wherein said quantum well region begins and terminates with said barrier layer.

19. The ultraviolet light emitting device as recited in claim 18 wherein said quantum well region comprises a single quantum well or multiple quantum layers.

20. The ultraviolet light emitting device as recited in claim 18, wherein said quantum well and said barrier layer have different $Al_xIn_yGa_{1-x-y}N$ compositions wherein $0 \leq x \leq 1$, $0 \leq y \leq 1$, $0 < x+y \leq 1$.

21. The ultraviolet light emitting device as recited in claim 18, wherein said quantum well region produces ultra-violet photons.

22. The ultraviolet light emitting device as recited in claim 1 wherein said mesa comprises a shape selected from round, obround, oval, trigonal and polygonal.

23. The ultraviolet light emitting device of claim 1 wherein said mesas have an equivalent diameter of 10 μm to 1 mm.

24. A method of making an ultraviolet light-emitting device, comprising the steps of:
   applying a first buffer layer comprising $Al_xIn_yGa_{1-x-y}N$, wherein $0 < x \leq 1$, $0 \leq y \leq 1$, $0 < x+y \leq 1$ to a substrate;
   forming trenches in said first buffer layer;
   applying a second buffer layer to said first buffer layer using pulsed lateral overgrowth technique to form a planar layer, said second buffer layer comprising $Al_xIn_yGa_{1-x-y}N$, wherein $0 < x \leq 1$, $0 \leq y \leq 1$, $0 < x+y \leq 1$;
   applying a superlattice layer on said second buffer layer, said superlattice layer comprising $Al_xIn_yGa_{1-x-y}N$, wherein $0 < x \leq 1$, $0 \leq y \leq 1$, $0 < x+y \leq 1$ to form a template;
   forming a first layer with a first conductivity on said template;
   forming a quantum well on said first layer;
   forming a second layer with a second conductivity on each said quantum well;
   forming a charge spreading layer on said first layer wherein said charge spreading layer has voids with said mesas passing through said voids and said charge spreading layer is separated from the furthest extent of each mesa a distance which does not exceed the current spreading length; and
   forming a conductive layer in contact with each said second layer.

25. The method of making an ultraviolet light-emitting device of claim 24 wherein said trenches in said first buffer layer at least 0.1 μm deep.

26. The method of making an ultraviolet light-emitting device of claim 24 wherein said second buffer layer coalesces.

27. The method of making an ultraviolet light-emitting device as recited in claim 24, wherein said first buffer layer is made of AlN and is trenched to a depth of at least 0.1 μm.

28. The method of making an ultraviolet light-emitting device as recited in claim 24 wherein said trenches has a width of at least 4 μm to no more than 700 μm.

29. The method of making an ultraviolet light-emitting device as recited in claim 24 wherein a distance between said trenches is at least 2 μm to no more than 1 mm.

30. An ultraviolet light-emitting device comprising:
   an template comprising:
      a first buffer layer, said buffer layer being trenched, and
      a second buffer layer over said first buffer layer, said second buffer layer comprising $Al_xIn_yGa_{1-x-y}N$, wherein $0 < x \leq 1$, $0 \leq y \leq 1$, $0 < x+y \leq 1$;
   a first layer with a first conductivity on said template wherein said first layer comprises an array of mesas;
   light emitting quantum well regions on each mesa of said mesas;
   a second layer with a second conductivity on each quantum well region of said quantum well regions;
   a first electrical contact in electrical contact with said first layer;
   a current spreading layer in electrical connection with said first electrical contact wherein said current spreading layer is no further than a current spreading length of any portion of said first layer;
   a second electrical contact in electrical connection with each said second layer; and
   a leakage suppression layer between each mesa of said mesa;
   a third electrical contact in electrical connection with said second electrical contact on each mesa of said mesas;
   whereby, when an electrical potential is applied to said first and second electrical contacts, said device emits ultraviolet light.

31. An ultraviolet radiation device comprising:
   a support structure wherein said support structure comprises a first surface and a second surface;
   a number of micropillars projecting away from said support structure wherein
   each micropillar of said micropillars comprises a first surface projecting away from said support structure;
   each micropillar comprises ultraviolet light emitting quantum well regions wherein said ultraviolet light emitting quantum well regions are deposited between a first $Al_xIn_yGa_{1-x-y}N$ ($0 < x \leq 1$, $0 \leq y \leq 1$, $0 < x+y \leq 1$) layer with n-type conductivity and a second $Al_xIn_yGa_{1-x-y}N$ ($0 < x \leq 1$, $0 \leq y \leq 1$, $0 < x+y \leq 1$) layer with p-type conductivity and wherein said first $Al_xIn_yGa_{1-x-y}N$ ($0 < x \leq 1$, $0 \leq y \leq 1$, $0 < x+y \leq 1$) layer is grown on a buffer layer comprising $Al_xIn_yGa_{1-x-y}N$ ($0 < x \leq 1$, $0 \leq y \leq 1$, $0 < x+y \leq 1$);
   a first metal electrode is electrically connected to said first $Al_xIn_yGa_{1-x-y}N$ ($0 < x \leq 1$, $0 \leq y \leq 1$, $0 < x+y \leq 1$) and a second metal electrode electrically connected to the second $Al_xIn_yGa_{1-x-y}N$ ($0 < x \leq 1$, $0 \leq y \leq 1$, $0 < x+y \leq 1$) layer;
   a leakage suppression layer in between said first electrode and said second electrode;

a third flat metal electrode is in electrical contact with said second electrode and deposited on top of said leakage suppression layer;

whereby when an electrical potential is applied to said first and third metal electrodes said device emits ultraviolet light radiation.

32. The ultraviolet radiation device of claim 31 wherein said micropillar has a diameter of no more than 500 μm.

33. A method of making an ultraviolet radiation device of claim 31 comprising forming mesa etching by forming a metallic mask comprising at least one element, or alloy of an element, selected from the group consisting of titanium, nickel, platinum, molybdenum, tungsten, palladium and gold.

34. A method of making an ultraviolet radiation device of claim 31 comprising mesa etching by reactive etching, inductively coupled plasma, wet chemical etching or a combination thereof.

35. A method of making an ultraviolet radiation device of claim 31 wherein formation of a mesa comprises a multistep RF power modulation with chlorine, boron chloride, carbon tetrachloride, methane, fluorine, argon gas or a combination thereof.

36. The method of making an ultraviolet radiation device of claim 35 wherein said wet chemical etching is done by an organic solution an acidic solution or a combination thereof.

37. The method of making an ultraviolet radiation device of claim 36 wherein said organic solution comprises at least one material selected from acetone, toluene, iso-propanol and methanol.

38. The method of making an ultraviolet radiation device of claim 36 wherein said acidic solution comprises at least one material selected from aqua-regia, buffered hydrofluoric acid, hydrochloric acid, acetic acid, sulfuric acid and nitric acid.

39. The ultraviolet radiation device of claim 31 wherein said first metal electrode comprise at least one layer of at least one material selected from titanium, aluminum, nickel, gold, palladium, platinum, vanadium, molybdenum and titanium nitride.

40. A method of making an ultraviolet radiation device of claim 31 wherein said metallic layers are subjected to single or multistep annealing.

41. The ultraviolet radiation device of claim 31 wherein said second metal electrode comprises at least one layer comprising at least one material selected from nickel, platinum, gold, palladium, indium oxide, indium tin oxide, nickel oxide, palladium oxide, zinc oxide and zirconium oxide.

42. The ultraviolet radiation device of claim 31 wherein said leakage suppression layer comprises at least one material selected from silicon-dioxide, silicon nitride, silicon oxynitride, SU-8, BCB and insulating polymer.

43. The ultraviolet radiation device of claim 31 wherein said third electrode is deposited on said leakage suppression layer and connecting each said micropillar.

44. The ultraviolet radiation device of claim 43 wherein said third flat metal electrode comprises at least one layer comprising at least one material selected from titanium, tungsten, copper, nickel, gold, palladium, platinum, vanadium, molybdenum and titanium nitride.

45. The ultraviolet radiation device of claim 31 wherein said ultraviolet device is a flipchip package device.

46. The ultraviolet radiation device of claim 45 wherein said flipchip package comprises a thermal carrier or a submount selected from AlN, SiC, Cu, CuW, Mo or a copper alloy.

47. The ultraviolet radiation device of claim 31 wherein said support structure further comprises a substrate, a first buffer layer, a first $Al_xIn_yGa_{1-x-y}$ ($0 \leq x \leq 1$, $0 \leq y \leq 1$, $0 < x+y \leq 1$) layer, said first buffer layer being between said substrate and said first $Al_xIn_yGa_{1-x-y}$ layer.

48. The ultraviolet radiation device of claim 31 wherein said substrate is removed by at least one method selected from laser assisted lift-off, lapping and polishing, wet chemical etching and ion milling.

* * * * *